(12) United States Patent
Gritters et al.

(10) Patent No.: US 8,756,802 B2
(45) Date of Patent: Jun. 24, 2014

(54) CARBON NANOTUBE CONTACT STRUCTURES FOR USE WITH SEMICONDUCTOR DIES AND OTHER ELECTRONIC DEVICES

(71) Applicant: FormFactor, Inc., Livermore, CA (US)

(72) Inventors: John K. Gritters, Livermore, CA (US); Rodney I. Martens, Livermore, CA (US); Onnik Yaglioglu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 13/731,259

(22) Filed: Dec. 31, 2012

(65) Prior Publication Data

US 2013/0140057 A1 Jun. 6, 2013

Related U.S. Application Data

(62) Division of application No. 12/418,368, filed on Apr. 3, 2009, now abandoned.

(51) Int. Cl.
*H01R 9/00* (2006.01)
*H01K 3/00* (2006.01)

(52) U.S. Cl.
USPC ............ 29/842; 977/842; 977/847; 174/260; 174/261

(58) Field of Classification Search
None
See application file for complete search history.

(56) References Cited

U.S. PATENT DOCUMENTS

| 7,585,548 B2 * | 9/2009 | Wang et al. ............... 427/256 |
| 2006/0085976 A1 * | 4/2006 | Eldridge et al. ............. 29/874 |
| 2007/0235713 A1 * | 10/2007 | Swirbel ........................... 257/7 |
| 2009/0066352 A1 * | 3/2009 | Gritters et al. ............... 324/755 |

* cited by examiner

*Primary Examiner* — Ishwarbhai B. Patel
*Assistant Examiner* — Dion Ferguson
(74) *Attorney, Agent, or Firm* — Kirton McConkie

(57) ABSTRACT

A method of making carbon nanotube contact structures on an electronic device includes growing a plurality of carbon nanotube columns on a mandrel. Electrically-conductive adhesive is applied to ends of the columns distal from the mandrel, and the columns are transferred to the electronic device. An electrically-conductive material is deposited onto some or all of the columns. The mandrel can be reused to grow a second plurality of carbon nanotube columns.

12 Claims, 16 Drawing Sheets

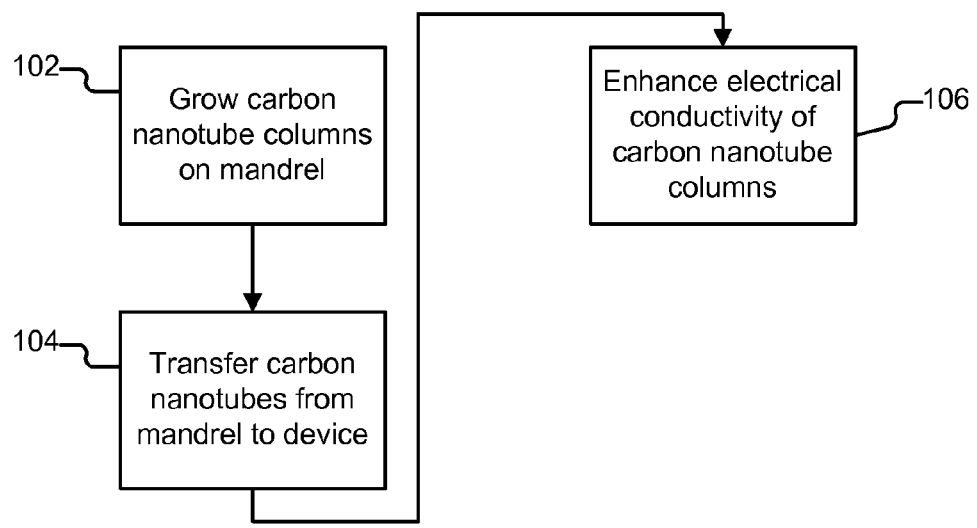
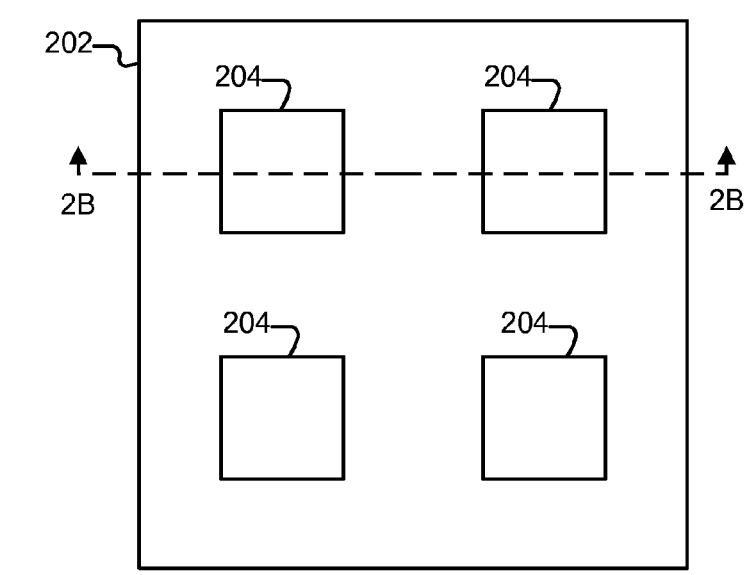

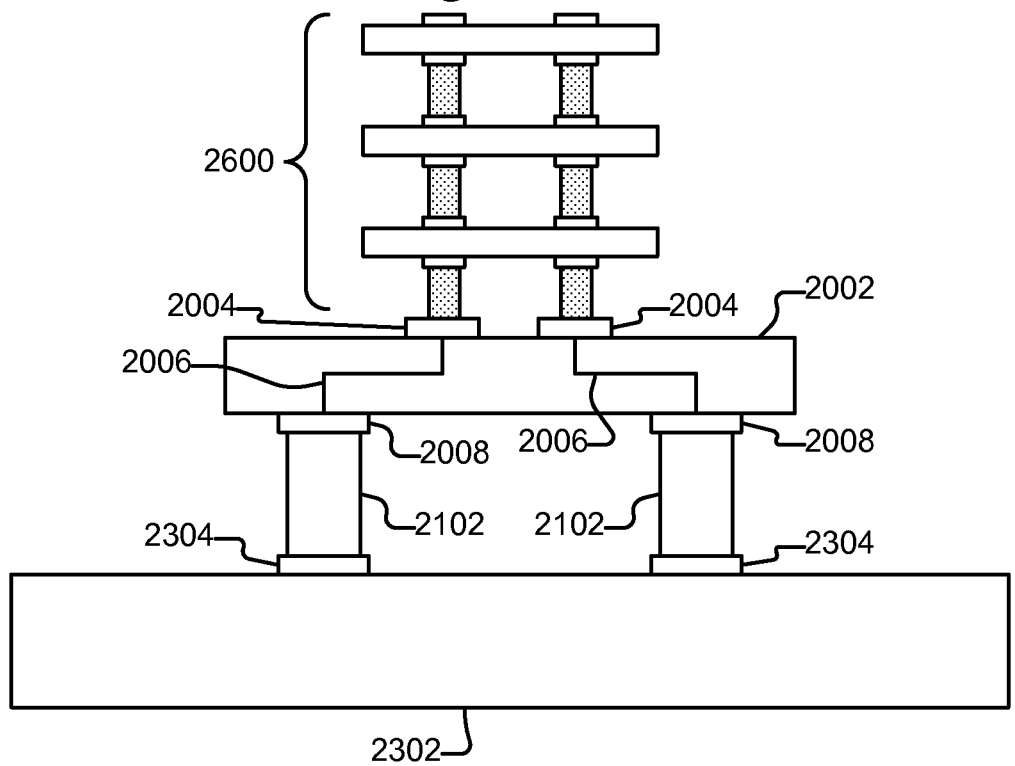
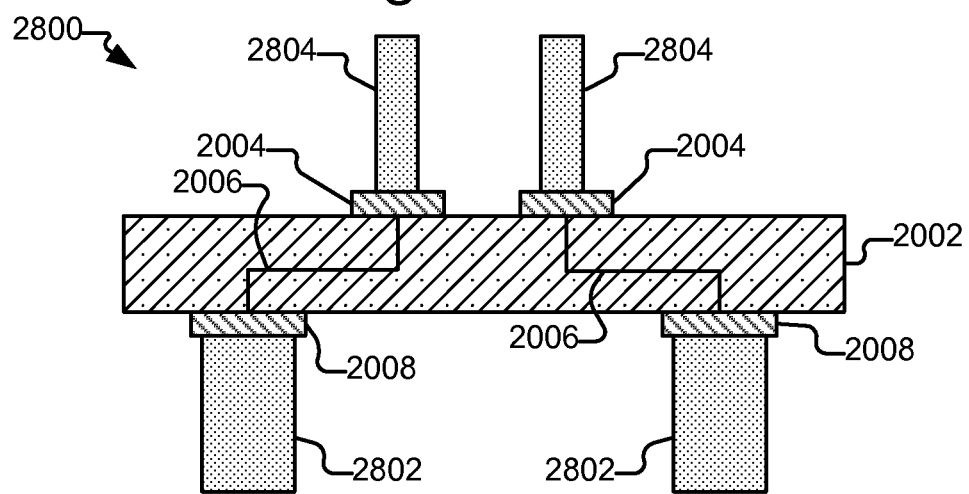

CARBON NANOTUBE CONTACT STRUCTURES FOR USE WITH SEMICONDUCTOR DIES AND OTHER ELECTRONIC DEVICES

CROSS REFERENCE TO RELATED APPLICATION(S)

This application is a division of U.S. patent application Ser. No. 12/418,368 (pending), which was filed Apr. 3, 2009 and is incorporated herein by reference in its entirety.

BACKGROUND

The present invention relates generally to apparatus and methods for using and making carbon nanotube contact structures.

Contact structures face many diverse design challenges. Contacts may be used to form permanent or temporary electrical connections to electronic devices. For example, a contact may be permanently attached to an electronic device for use as an input/output terminal. As another example, a contact may be temporarily attached to an electronic device, for example for testing of device during a manufacturing process. Very small contacts are desirable for application to fine pitch electronic devices.

Contact structures may be interfaced to various different materials, including for example, aluminum bond pads on an integrated circuit die, gold sockets or contacts (e.g., in a socket or connector), copper traces (e.g., on a circuit board). Depending on the type of material being electrically connected by the contact, different requirements may be presented. For example, in some cases it is desirable for the contact to be break through a non-conductive or poorly conductive metal oxide layer. In other cases, it is desirable for the contact to provide resiliency to help maintain a desired contact force in the presence of mechanical irregularities or thermal expansion induced dimensional changes.

SUMMARY

In some embodiments of the invention, a method of making carbon nanotube contact structures on an electronic device can include growing carbon nanotube columns on a mandrel. An electrically-conductive adhesive can be applied to ends of the columns distal from the mandrel. The columns can be transferred to the electronic device by bringing the ends of the columns distal from the mandrel into contact with the electronic device and separating the mandrel from the columns. The columns can be attached by the electrically-conductive adhesive. Another operation in the method can be depositing an electrically-conductive material on the columns. The mandrel can be reused.

BRIEF DESCRIPTION OF THE DRAWINGS

FIG. 1 is a flow chart showing a process of making carbon nanotube contact structures in accordance with some embodiments of the invention.

FIGS. 2A-9 show a contact structure being fabricated using one variation of a process as in FIG. 1 in accordance with some embodiments of the invention as described further below.

FIG. 2A is a top view illustration of a mandrel.

FIG. 3 is a side cross section illustration of the mandrel of FIGS. 2A and 2B with columns grown thereon.

FIG. 4 is a side cross section illustration of an adhesive material being applied to ends of the columns of FIG. 3 using adhesive stamping.

FIG. 5 is a side cross section illustration of the columns of FIG. 3 being transferred to a device and released from the mandrel.

FIG. 8 is a side cross section illustration of the device of FIGS. 7A and 7B after a conductive adhesive material is applied to the columns.

FIG. 9 is a side cross section illustration of the device of FIG. 8 after a tip is attached to the columns.

FIG. 10 is a side cross section view of columns grown on a mandrel after a conductive material is applied.

FIG. 11 is a side cross section view of the columns of FIG. 10 having an adhesive material being applied.

FIG. 12 is a side cross section view of the columns of FIG. 11 being attached to a device with an adhesive material and released from the mandrel.

FIG. 13 is a side cross section view of the columns of FIG. 12 after being attached to a device and having an end structure applied.

FIG. 14 is a side cross section view illustration showing columns grown on a mandrel having an adhesive material applied to the ends of the columns.

FIG. 15 is a side cross section view illustration showing the columns of FIG. 14 after being attached to a device and separated from the mandrel.

FIG. 16 is a side cross section view illustration showing the device of FIG. 15 after a conductive material is applied to the columns.

FIG. 17 is a side cross section view illustration of columns grown on a mandrel and having a conductive material applied to the sides of the columns.

FIG. 18 is a side cross section view illustration of the columns of FIG. 17 after being attached to a device with an adhesive material and separated from the mandrel.

FIG. 19 is a side cross section view illustration of the device of FIG. 18 after an end structure has been applied to the columns.

FIG. 27 is a side view illustration of a die stack attached to a substrate in accordance with some embodiments of the invention.

FIG. 28 is a side view illustration of an interposer in accordance with some embodiments of the invention.

DETAILED DESCRIPTION OF EXEMPLARY EMBODIMENTS

Figure 2B:
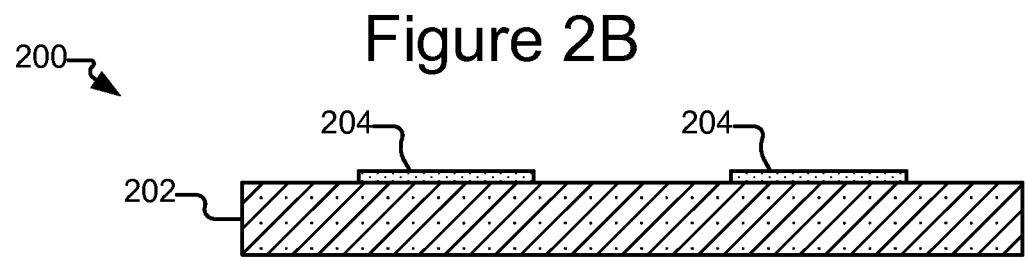
FIG. 2B is a side cross section illustration of the mandrel of FIG. 2A.

This specification describes exemplary embodiments and applications of the invention. The invention, however, is not limited to these exemplary embodiments and applications or to the manner in which the exemplary embodiments and applications operate or are described herein. Moreover, the Figures can show simplified or partial views, and the dimensions of elements in the Figures can be exaggerated or otherwise not in proportion for clarity.

As the term "on" is used herein, one object (e.g., material, layer, substrate, etc.) can be "on" another object regardless of whether the one object is directly on the other object or there are one or more intervening objects between the one object and the other object. Additionally, directions (e.g., above, below, top, bottom, side, under, over, "x," "y," "z," etc.) are relative and provided solely by way of example and for ease of illustration and discussion, and not by way of limitation.

In accordance with some embodiments of the invention, a process of making a contact structure is illustrated in flow chart form in FIG. 1 and will now be described generally. The process can include growing carbon nanotubes on a mandrel at 102. Various ways of growing carbon nanotubes can be used, and various non-limiting examples are provided below. At 104, the carbon nanotubes can be transferred from the mandrel to an electronic device. For example, electronic devices can include a semiconductor wafer having a plurality of unsingulated dies disposed thereon, one or more singulated dies (e.g., held in or on a carrier or other holding device), a multi-die electronics module, a wiring substrate (e.g., a printed circuit board, multi-layer ceramic substrate, or the like), an element of a probe card assembly (e.g., an interposer or probe contactor or the like), other contactor for contacting and testing electronic devices (e.g., semiconductor dies), a socket (e.g., a solder grid array socket), or any other suitable type of or element of an electronics module or device. Various ways of transferring the carbon nanotubes to the electronic device can be used, and various non-limiting examples are provided below. As one example, an electrically-conductive adhesive can be applied to ends of the columns, and the ends of the columns brought into contact with the electronic device and cured for attachment.

After transfer of the carbon nanotubes to the electronic device, the carbon nanotubes can be separated from the mandrel, for example by physical separation as described further below. The mandrel can be reused to grow additional carbon nanotube columns, for example for application to other portions of the electronic device or to a second electronic device.

At 106, the electrical conductivity of the carbon nanotube columns can be enhanced. For example conductive material can be applied to the carbon nanotube columns. The conductive material can be applied in various ways. For example, in some embodiments, a stencil mask (or shadow mask) can be used to select areas to which the conductive material is applied to the columns to help avoid creating short circuits between adjacent columns. Various conductive materials can be used, including by way of example and not limitation, electrically-conductive materials such as gold, silver, copper, aluminum, nickel, rhodium, palladium, cobalt, and combinations and alloys thereof.

Following 102, operations 104 and 106 can be performed in either order. In other words, after the carbon nanotube columns have been grown on the mandrel, the electrical conductivity of the carbon nanotube columns can be enhanced, and then the carbon nanotubes can be transferred from the mandrel to the electronic device. Alternately, after the carbon nanotube columns have been grown on the mandrel, they can be transferred from the mandrel to the electronic device and then the electrical conductivity of the carbon nanotubes can be enhanced. If desired, operation 106 can be performed both before and after operation 104. In other words, conductive material can be applied to the columns while they are on the mandrel, and additional conductive material can be applied to the columns after they are transferred to the electronic device.

Numerous variations of the process of FIG. 1 can also be performed, and additional or substitute processing operations included, as will become more apparent from the following discussion.

An exemplary embodiment of the process of FIG. 1 will now be described in conjunction with FIGS. 2A-9 which illustrate devices used and made in undergoing the process in accordance with some embodiments of the invention. It will be appreciated, however, that the process is not limited to the specific example illustrated here.

Figure 3:
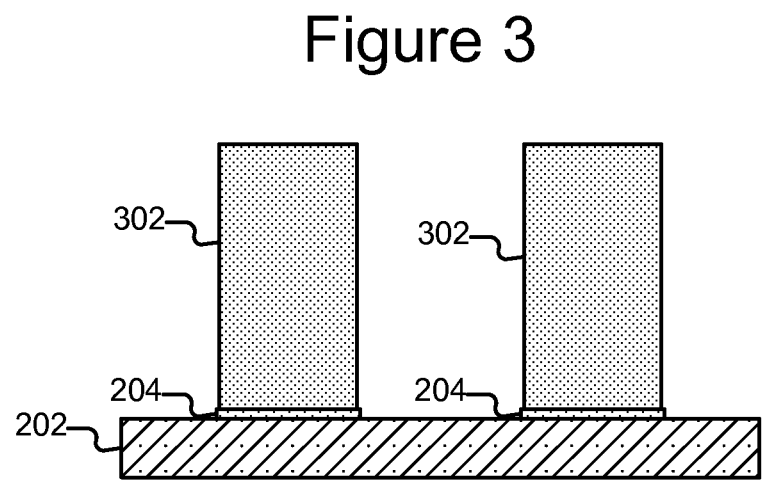

One example of operation 102 is illustrated by FIGS. 2A-3 in accordance with some embodiments of the invention. FIGS. 2A and 2B illustrate an example of a mandrel 200 used in fabricating carbon nanotube contact structures. The mandrel 200 can include a substrate 202 which includes growth surfaces 204 on which carbon nanotube columns can be grown. The substrate 202 can be any structure suitable for supporting the columns. Non-limiting examples of suitable substrates 202 include a semiconductor wafer, a ceramic substrate, a substrate comprising an organic material, a substrate comprising an inorganic material including metals, or combinations thereof. Growth surfaces 204 can be deposited on the substrate 202, or alternatively, the substrate 202 can be provided with growth surfaces 204. For example, growth surfaces 204 can be exposed portions of a growth material layer (not shown) exposed through holes in a masking layer (not shown). As another example, growth material (not shown) can be deposited on substrate 202, and then patterned to create growth surfaces 204. Patterning of growth material or masking layers can be performed using various techniques, such as for example, photolithography.

The growth surfaces 204 can be any material suitable for growing carbon nanotube columns. For example, growth surfaces 204 can be material with an oxide film or material on which an oxide film can be formed so that growth surfaces 204 comprise an oxide. For example, growth surfaces 204 can comprise an oxide film on a silicon material. As another example, growth surfaces can comprises quartz.

Various ways of growing carbon nanotubes on the growth surfaces 204 can be used. For example, carbon nanotubes can be grown using a floating catalyst process, also referred to as vapor phase catalyst process. In a floating catalyst process, the growth surfaces 204 can comprise a material on which carbon nanotube columns will grow in the presence of a catalyst and a source of carbon under proper environmental conditions. A source of carbon can be in the form of a gas to which the growth surfaces 204 are exposed. For example, the mandrel 200 can be placed into an enclosure, the enclosure heated, and a gas comprising a catalyst and a source of carbon introduced into the interior of the enclosure. Various catalyst materials, carbon source materials, and other materials (e.g., process gasses), process temperature and process time can be used.

As a specific non-limiting example, a floating catalyst process for growing carbon nanotubes is disclosed in commonly-owned co-pending U.S. patent application Ser. No. 11/872,008, filed Oct. 13, 2007, entitled "Making and Using Carbon Nanotube Probes," which is herein incorporated by reference.

As another example, a fixed catalyst process can be used to grow carbon nanotubes. In a fixed catalyst process, growth surfaces 204 can include a catalyst material on which carbon nanotube columns will grow in the presence of a source of carbon. Examples of growth surfaces 204 include transition metals including iron. A source of carbon can be in the form of a gas to which the growth surfaces 204 are exposed. For example, the mandrel 200 can be placed into an enclosure, the enclosure heated, and a gas comprising a source of carbon introduced into the interior of the enclosure. Various carbon source materials, and other materials (e.g., process gasses), process temperature and process time can be used.

As a specific non-limiting example, a fixed catalyst process for growing carbon nanotubes is disclosed in U.S. patent application Ser. No. 11/872,008, referenced above.

Although not shown in FIG. 2, a buffer layer can be included between growth surfaces 204 and substrate 202. The buffer layer can include a material that does not react appreciably to the source of carbon to which growth surfaces are exposed. For example, the buffer layer can include aluminum oxide ($Al_2O_3$). Growth surfaces 204 can be deposited on the buffer layer.

Regardless of the specific technique used, the carbon nanotube columns grown on growth surfaces 204 can be grown to extend upwards from growth surfaces 204 and substrates 202, for example to form carbon nanotube columns 302 as illustrated in FIG. 3. Although two columns 302 are shown growing from substrate 202, more or fewer columns 302 can be grown from substrate 202. For example, a large number of growth surfaces 204 can be provided on the mandrel 200 allowing an equally large number of columns 302 to be grown simultaneously.

The columns 302 can comprise a plurality of individual carbon nanotubes. Carbon nanotubes can be fiber-like structures, and can be intertwined in a mass. The carbon nanotubes that compose a column 302 can bend and/or twist and thus be intertwined one with another. Accordingly, each column 302 can comprises numerous individual carbon nanotubes intertwined into a mass to form the structure of the column 302. For example, columns 302 can each comprise few (e.g., tens) or many (e.g., thousands or hundreds of thousands) of individual nanotubes.

An individual carbon nanotube in a column can have a number of attributes including without limitation the following: the number of walls and the thickness of the wall(s) of the carbon nanotube, the diameter of the carbon nanotube, and the chirality (rolling angle) of the carbon nanotube. In addition, a group of carbon nanotubes intertwined to form a structure like columns 302 can have a number of attributes including without limitation the following: the average spacing between individual carbon nanotubes in the group, the average length of the carbon nanotubes in the group, and the alignment or orientation of the carbon nanotubes in the group.

The carbon nanotubes in each of columns 302 are not limited to having any particular number of walls, thickness of the walls, diameter, or chirality, nor are the carbon nanotubes that form a column 302 limited to a particular average spacing between carbon nanotubes, average length, or alignment.

In some embodiments, each column 302 can comprise vertically aligned carbon nanotubes. A column comprising vertically aligned carbon nanotubes can be termed a "vertically aligned" carbon nanotube column. Any of the columns of carbon nanotubes described herein, including without limitation columns 302, can be vertically aligned.

As used herein, a column (e.g., column 302) of carbon nanotubes is "vertically aligned" if most (i.e., 50% or more) of the carbon nanotubes that compose the column form a continuous path along a length of the column that start at one end of the column and end at an opposite end. In some embodiments, a greater percentage than 50% of the carbon nanotubes in a column 302 can be vertically aligned. For example, in some embodiments, 60%, 70%, 75%, 80%, 90%, 95%, 98%, 99%, or a greater percentage of the carbon nanotubes that compose a column 302 can be vertically aligned. In some embodiments, a single carbon nanotube can comprise a plurality of tubes that are grown directly one atop the other resulting in a continuous path.

The columns can have any suitable cross section geometry. Although FIGS. 2A, 2B, and 3 and their accompanying text and other Figures and their accompanying text elsewhere in this description illustrate a square type cross-section, the square type cross section is used simply for ease of description. Other cross sections are equally possible and specifically contemplated. For example, circular, ring (or doughnut), triangular, as well as other cross sectional shapes can also be used. Accordingly, the shape of the growth areas 204 can be circular, ring (or doughnut), triangular, as well as other shapes.

Furthermore, not all columns 302 need have the same cross section. The mandrel 200 can include growth areas 204 having different shapes, allowing for columns of different shape to be simultaneously made by the process.

Figure 4:
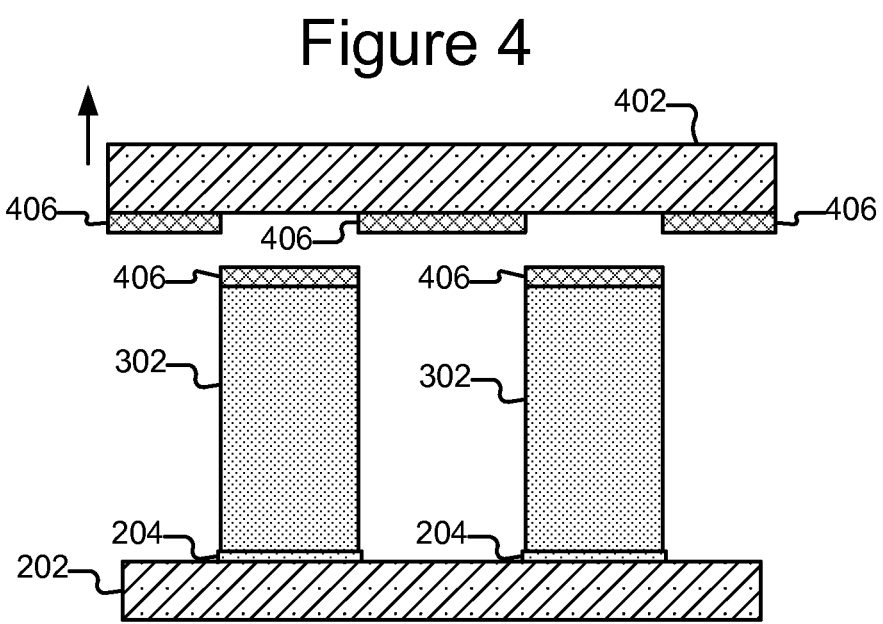
Figure 5:
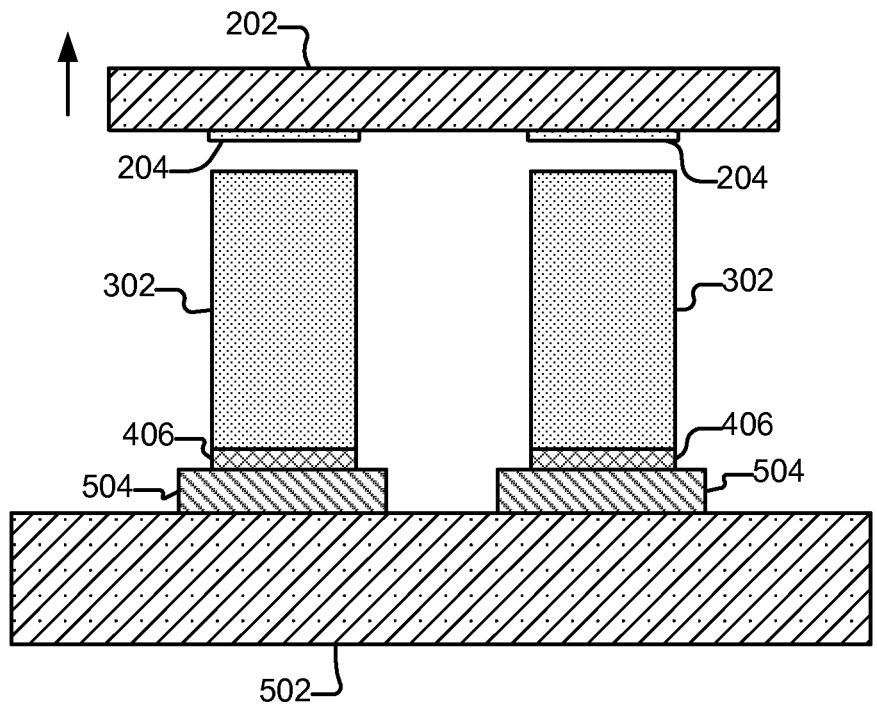

One example of operation 104 (FIG. 1) is illustrated by FIGS. 4 and 5. As illustrated in FIG. 4, an adhesive material 406 can be applied to the exposed ends of the columns 302. For example, the adhesive material can be applied using a stamping tool 402 to which the adhesive material 406 is applied. The adhesive material 406 can be deposited onto the stamping tool 402 using various techniques. For example, the adhesive material can be screened, printed, spin coated, or otherwise applied, coated, or deposited onto the stamping tool.

The stamping tool can be pressed against ends of the columns 302 and then removed to apply the adhesive material 406 to the ends of the columns 302. At places where the ends of the columns 302 contact the adhesive material 406, the adhesive material 406 can stick to the ends of the columns 302. Upon removal of the stamping tool 402, adhesive material 406 stuck to the ends of the columns can remain stuck to the ends of the columns and separate from the stamping tool 402. A release material (not shown) can be included on the stamping tool 402 to aid in allowing the adhesive material 406 to release from the stamping tool 402 and adhere to the ends of the columns 302. As another example, the stamping tool 402 can be constructed of a material to which the adhesive material 406 does not readily adhere, aiding in release of the adhesive material 406 from the stamping tool 402 when the stamping tool is brought into contact with columns 302 and then pulled away.

The adhesive material 406 may wick into the columns 302. In other words, the adhesive material 406 may flow in between individual carbon nanotubes that compose the columns 302. For example, flow of the adhesive material can be caused in whole or in part by capillary forces, gravity, or both.

The distance along the column 302 that adhesive material 406 wicks can depend on a number of factors including, without limitation, the amount of time adhesive material 406 is cured, the viscosity of adhesive material 406, orientation of the column 302, ambient conditions such as temperature, air pressure, and/or other factors.

If desired, a material that inhibits the spread of adhesive material 406 through columns 302 can be applied to all or part of columns 302. For example, parylene (not shown) can be applied (e.g., by chemical vapor deposition) to portions of columns 302 to prevent adhesive material 406 from spreading into those portions of columns 302 or at least to impede or significantly slow the spread of adhesive material 406 into those portions of columns 302 where the parylene is applied. Other techniques for inhibiting the wicking of adhesive material are described further below. For example, conductive material applied to the column can also cover the end, helping to avoid wicking of the adhesive material.

Other ways of applying the adhesive material 406 to the exposed ends of the columns 302 can also be used. For example, the adhesive material 406 can be patterned on the stamping tool 402 so that adhesive is placed onto the stamping tool 402 in a pattern corresponding to the exposed ends of the columns.

Various adhesive materials 406 can be used. For example, the adhesive material 406 can be an electrically conductive material, such as a conductive epoxy. For example, conductive epoxy can contain particulates of a conductive material (e.g., a conductive metal such as silver, copper, gold, etc.). As another example, the adhesive material 406 can be non-conductive epoxy.

The columns can be attached to an electronic device by bringing the ends of the columns 302 with adhesive material 406 into contact with terminals 504 of a device 502 as shown in FIG. 5 in accordance with some embodiments of the present invention. Various devices can be used, for example, as described above. The terminals 504 can be electrically conductive elements on device 502, for example, bond pads, traces, or other conductive elements. Terminals 504 can be electrically connected to other terminals (not shown) and/or electrical circuitry (e.g., integrated circuits, resistors, capacitors, transistors, etc. not shown) on or in device 502.

After bringing the ends of the columns 302 in contact with the adhesive material 406, if needed, the adhesive material 406 can be cured. For example, curing can be performed by heating the adhesive material, allowing the adhesive material to be exposed to ambient air for a particular period of time, exposing the adhesive material to ultraviolet light, or any other suitable manner.

The columns 302 can be released from the mandrel 200 using various means, including physical separation, applying a mechanical shock, applying a thermal shock, or other suitable means. For example, the adhesive material can be selected to provide a stronger bond between the ends of the columns 302 and the terminals 504 than the bond between the columns 302 and the growth surfaces 204 so that the columns 302 remain attached to the terminals 504 and separate from the growth surfaces 204 when the mandrel 200 is pulled away from the device 502. Generally, the interface of the columns 302 to the growth surfaces 204 is much weaker than the strength of the columns.

As another example, the columns 302 can be released from the mandrel 200 by applying a thermal shock. For example, a thermal shock can be applied by subjecting and or all of the device 502, columns 302, and mandrel 200 to a rapid temperature change. As a particular non-limiting example, a thermal shock can be applied by impinging a rinse solution or cold (below room temperature) clean dry air onto the device 502, columns 302, and/or mandrel 200.

Once the columns 302 are released from the mandrel 200, the mandrel 200 can be reused. That is, new columns like 302 can be grown on growth surfaces 204. The new columns can be applied to another device, like device 502. If desired or necessary, the mandrel can be cleaned or other treatments applied before reuse. A reusable mandrel 200 can provide various benefits, including a reducing in process cycle times, reduced waste, reduced cost, and/or increased repeatability in growing columns 302.

For example, in some embodiments, by growing the columns 302 on the mandrel 200, exposure of device 502 to the process conditions used to grow columns 302 can be avoided. Accordingly, process conditions used for growing columns 302 can be selected without regard to effect it might have on device 502, since device 502 is not exposed to the environment used to grow the columns. In particular, growth of columns can occur at a temperature of about 800 C, which is generally detrimental to semiconductor device. Moreover, placement of protective or masking layers over device 502 to control the growth of the columns can be avoided, since the columns are grown on mandrel 200 and transferred in bulk to device 502.

Figure 6A:
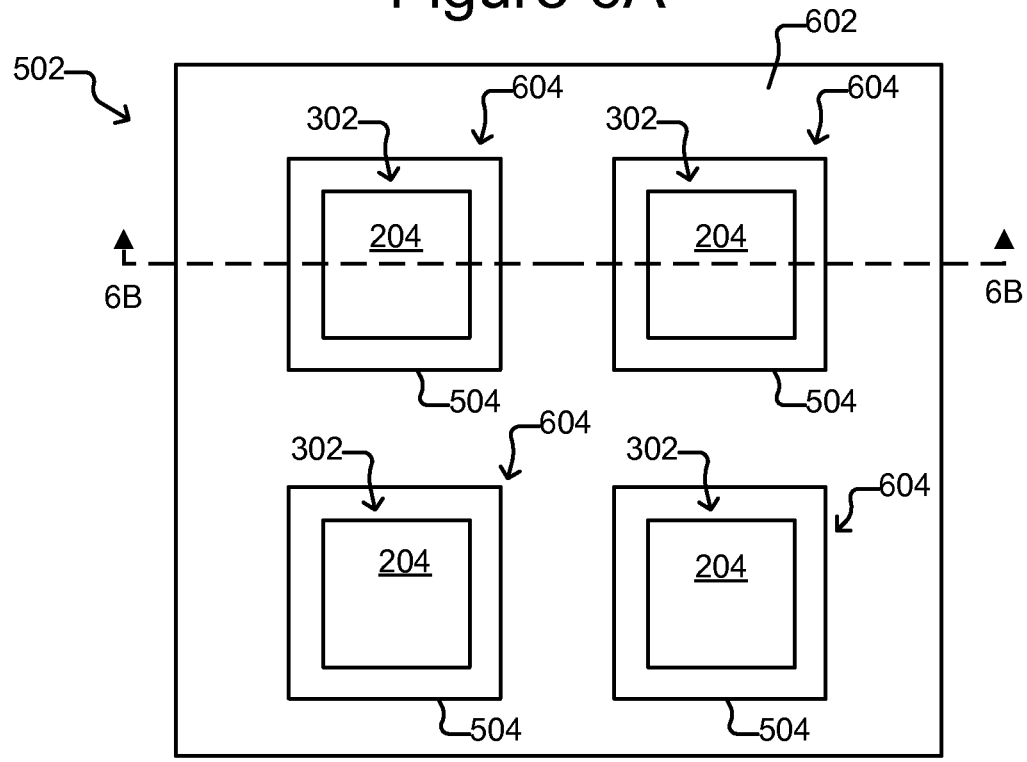
FIG. 6A is a top view illustration of the device of FIG. 5 with a stencil mask being applied.
Figure 6B:
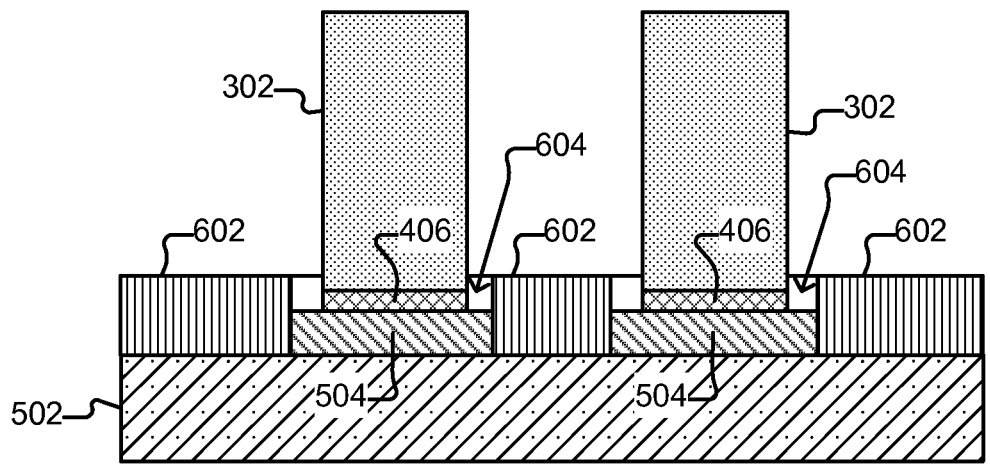
FIG. 6B is a side cross section illustration of the device of FIG. 6A.

An example of operation 106 (FIG. 1) is illustrated by FIGS. 6A-7B. As shown in FIGS. 6A and 6B, a mask 602 can be placed over device 502. The mask 602 can include openings 604 that expose the columns 302 and terminals 504. The mask 602 can be formed of any suitable material, and can be applied to device 502 using any suitable technique. For example, mask 602 can be a stencil mask which is positioned over device 502 and can be reused.

As another example, mask 602 can comprise a photo reactive material (e.g., a photo resist material) than can be deposited (e.g., using spray coating) in a blanket layer onto device 502, after which selected portions of the photo reactive material can be cured by exposure to light, and the uncured portions of the material removed to form openings 604. Other non-limiting examples of suitable mask materials include any material than can be deposited in a pattern than includes openings 604 or can be deposited and then patterned to have openings 604. Organic based resist or other materials (e.g., polymers) are non-limiting examples of such a material.

Figure 7A:
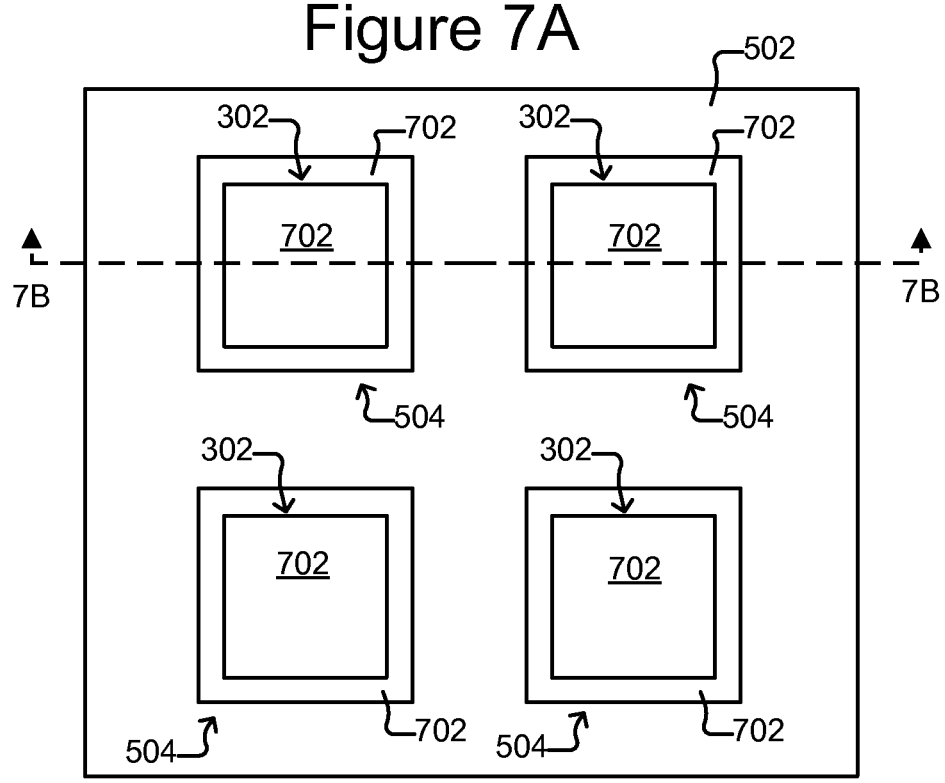
FIG. 7A is a top view illustration of the device of FIG. 6 with a conductive material being applied to the columns.
Figure 7B:
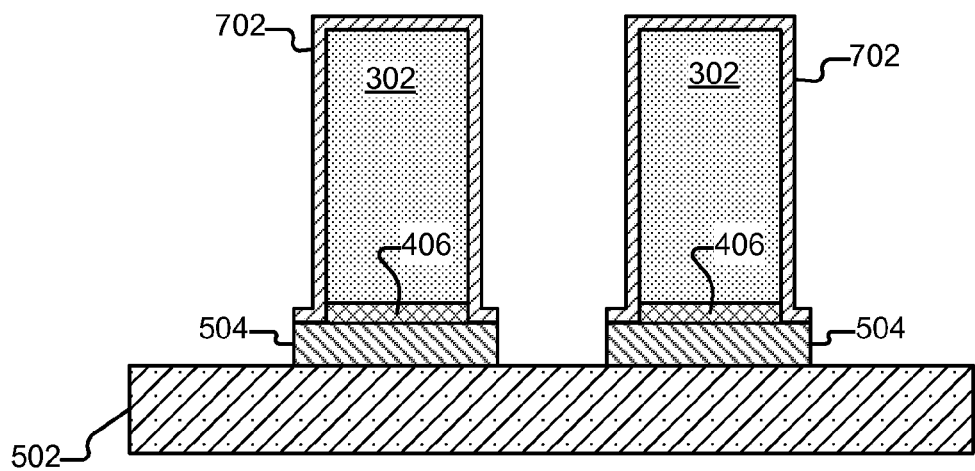
FIG. 7B is a side cross section illustration of the device of FIG. 7A.

Electrically conductive material 702 can be applied to the exposed columns 302 and terminals 504, for example, as illustrated in FIGS. 7A and 7B. The mask can help to prevent the electrically conductive material 702 from depositing on device 502 or other areas it is not wanted. The electrically conductive material 702 can be a material selected for its electrical conductivity characteristics. For example, electrically conductive material can include gold, silver, copper, and combinations thereof. Following deposition of the electrically conductive material 702, the mask 602 can be removed. For example, the mask 602 can be removed by physically lifting off the stencil, or using an organic mask lift off process by exposing the mask to a solvent, chemical stripping techniques that will lift off and pattern the conductive material, or any other suitable technique.

The electrically conductive material 702 can be applied by various techniques. For example, the electrically conductive material 702 can be electroplated, electroless plated, sputtered, chemical vapor deposited, atomic layer deposited, or otherwise applied to the columns 302. Although the electrically conductive material 702 is shown in FIG. 7B as a uniform thickness layer disposed on the exterior of the columns 302, it will be appreciated that other configurations of the electrically conductive material can also be achieved. For example, the electrically conductive material 702 can extend into the columns 302, partially or completely filling space between individual carbon nanotubes that compose the columns 302. For example, the electrically conductive material 702 can penetrate into the columns and deposit on to individual carbon nanotubes inside the column, fill gaps between carbon nanotubes inside the column, or combinations thereof.

Various electrically conductive materials can be used. For example, the electrically conductive material can be aluminum applied by sputtering. As another example, the electrically conductive material can be gold.

Applying an electrically conductive material 702 to the columns 302 can provide various benefits. For example, electrically conductive material 702 can help to provide a lower resistance connection through a contact structure comprising the columns as compared to the carbon nanotubes alone. As another example, electrically conductive material 702 can provide a surface which helps to provide a more reliable connection to device terminals 504 than the ends of native carbon nanotubes.

Electrically conductive material 702 can be directly electrically connected to terminals 504. Electrically conductive material can also be indirectly electrically connected to terminals 504 through columns 302 and adhesive material 406, if adhesive material 406 is an electrically conductive adhesive material.

Figure 8:
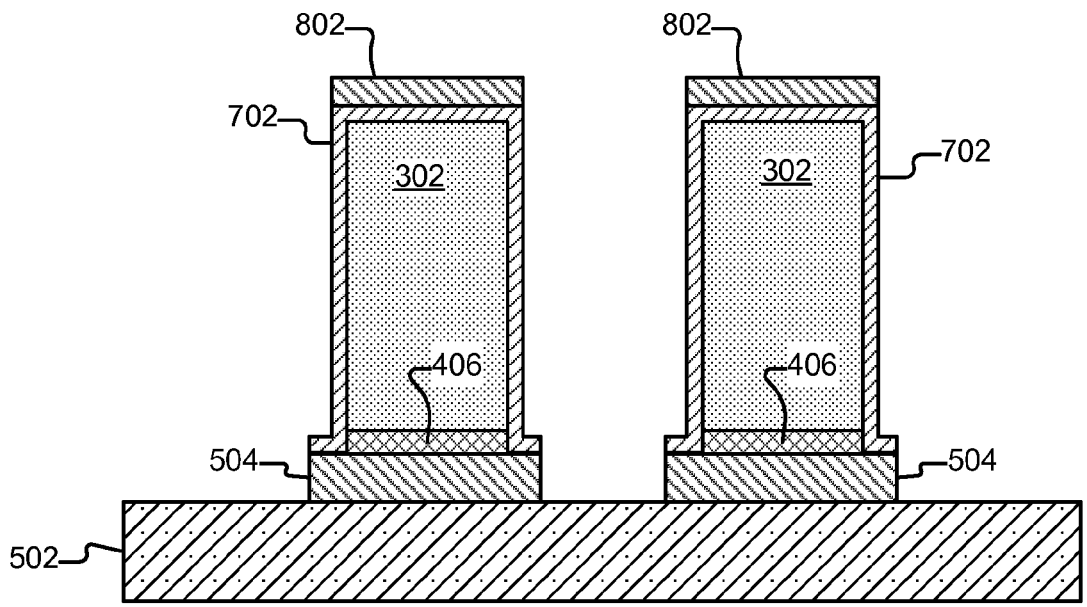
Figure 9:
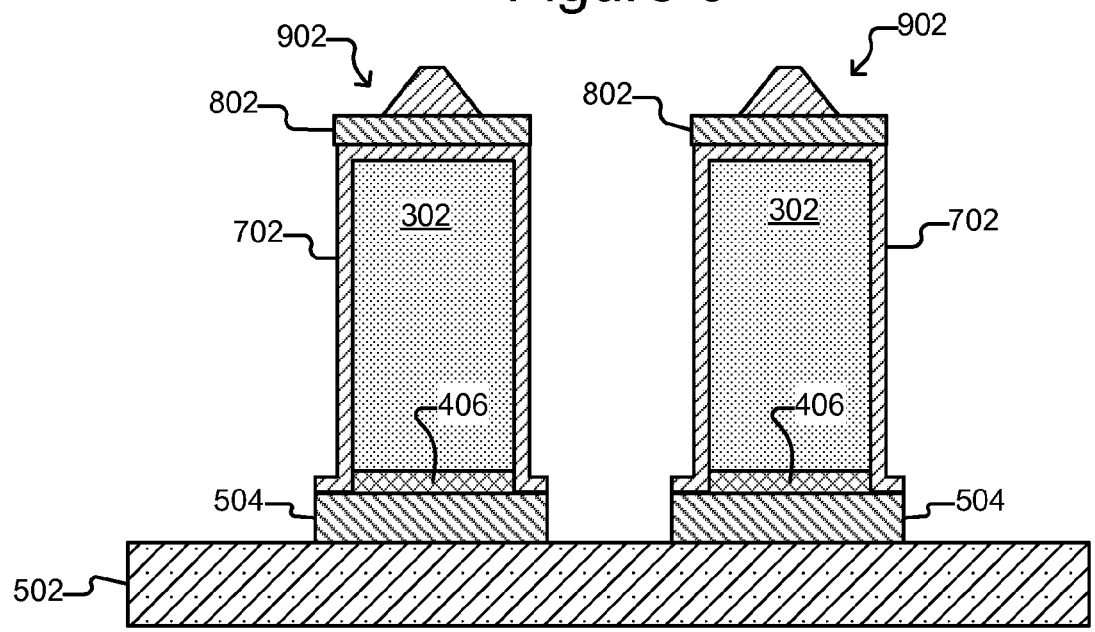

Additional processing operations can also be included in the process of FIG. 1 if desired. For example, FIGS. 8 and 9 illustrate additional processing operations to form tip structure 902 on the columns 302.

An electrically conductive adhesive material 802 can be applied to the columns 302. Electrically conductive adhesive material 802 can be the same as, or different from, adhesive material 406. For example, the conductive adhesive material 802 can be conductive epoxy. As another example, the conductive adhesive material 802 can be solder. The conductive adhesive material can be applied to the columns using similar techniques as illustrated above in FIG. 5.

Contact tip structures can be attached to the columns 302 using various techniques. For example, contact tip structures 902 can be attached to columns 302 using adhesive material 802. Contact tip structures 902 can be shaped to provide desired contact characteristics. For example, the tip structures 902 can include points, tips, blade-like, or other suitable features to help in breaking through oxide layers of a terminal to which they make contact when used. The contact tip structures can be made of material or combinations of materials selected to provide desired contact characteristics. For example, tip structures 902 can include a rigid metal, such as nickel, palladium, rhodium, cobalt, or combinations or alloys of the foregoing. As a particular non-limiting example, palladium cobalt can be used. Palladium cobalt contacts can provide high durability while tending to reduce accumulation of debris (e.g., solder) when used for repeated contacting, such as in a probe card. Alternately, or in addition, tip structures can include materials selected to provide desired bonding characteristics, for example, for adhesion to solder, conductive epoxy, and similar materials used for electrically conductive attachment. Tip structures can be formed in various ways, including for example forming the tip structures using a lithographic process.

The example shown in FIGS. 2A-9 is but one example of a process for making contact structures, and many variations are possible. For example, FIGS. 10-13 illustrate an alternate example of operations 102 and 104 of the process of FIG. 1. In the example of FIGS. 10-13, conductive material is deposited onto the columns before they are attached or transferred to a device. The process can initially proceed similarly to that described in FIGS. 2A-9, where columns 302 can be grown on growth surface 204 of a mandrel 200, as shown in FIGS. 2A and 3.

Figure 10:
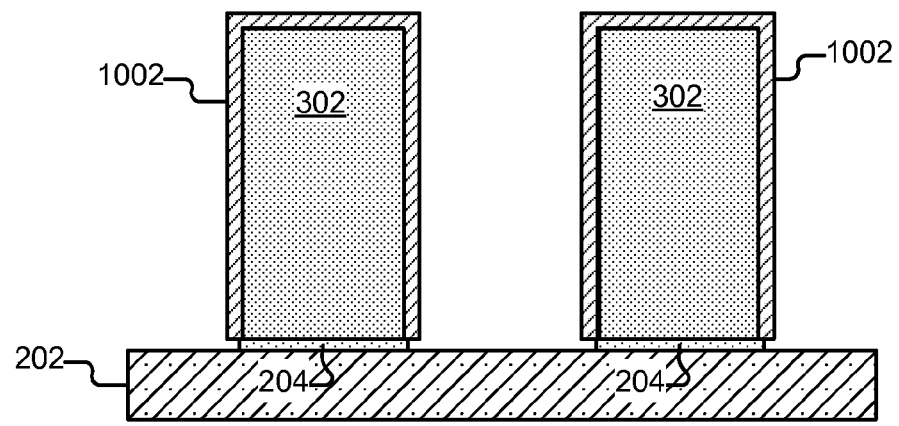
FIGS. 10-13 show a contact structure being fabricated using another variation of a process as in FIG. 1 in accordance with some embodiments of the invention as described further below.

Then, as shown in FIG. 10, a conductive material 1002 can be applied to the columns 302. Conductive material can be like conductive material 702, and can be applied in similar manners as described above with respect to FIGS. 7A and 7B. Conductive material can be removed from between columns, for example using processes similar to that described above with respect to FIG. 6B.

Figure 11:
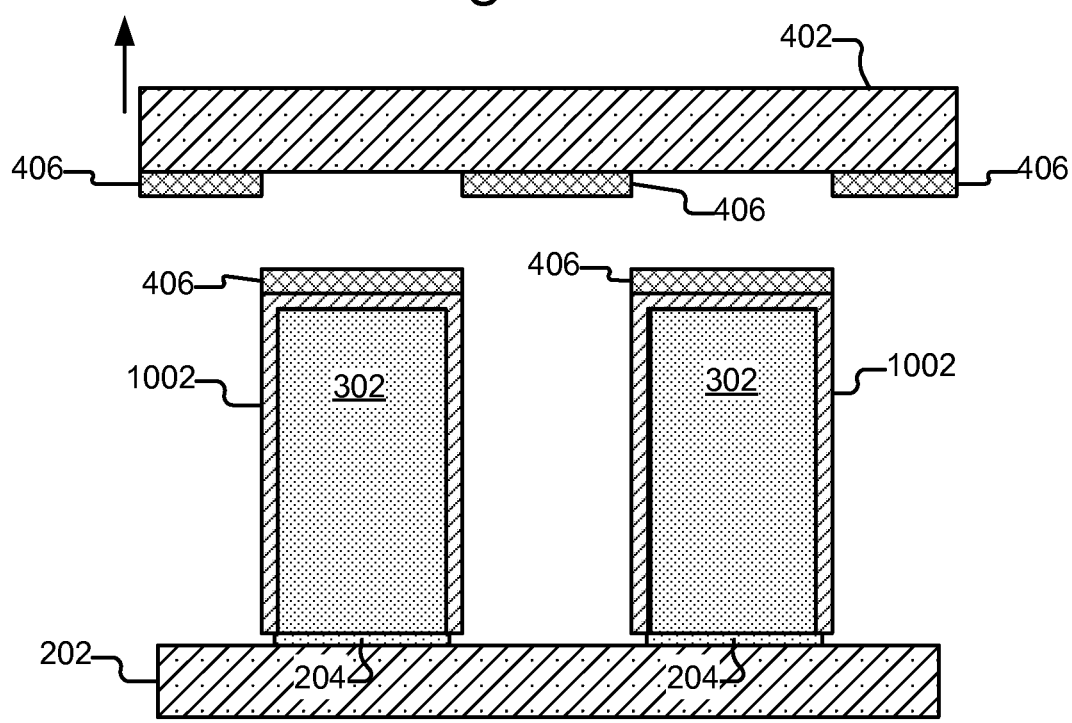

As shown in FIG. 11, an adhesive material 406 can be applied to ends of columns 302. Adhesive material 406 can applied as described above with respect to FIG. 4. Wicking of adhesive material 406 can be inhibited or prevented by the presence of conductive material 1002.

Figure 12:
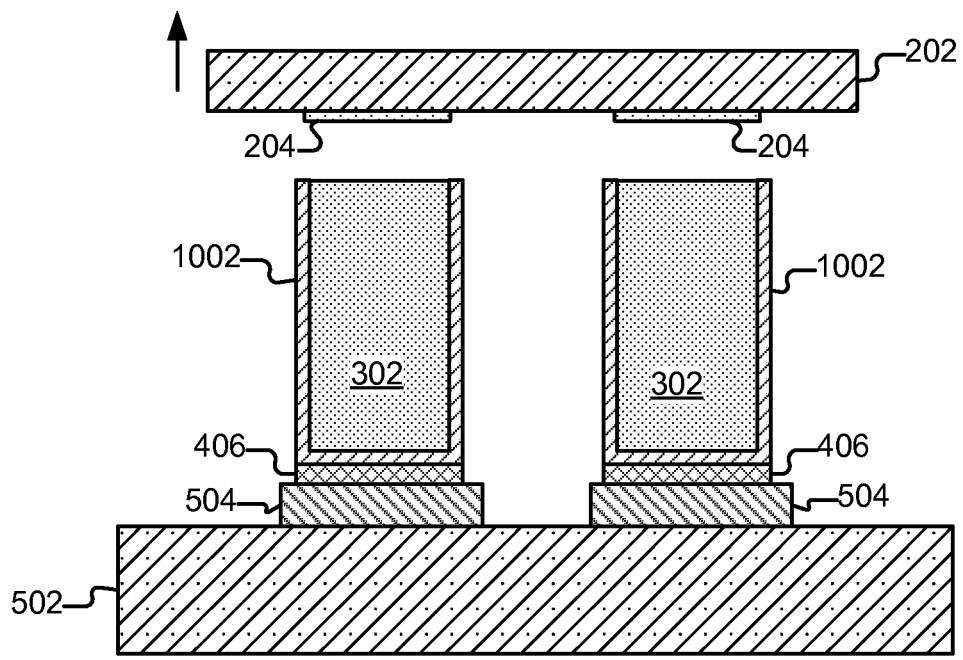

As shown in FIG. 12, columns 302 can be attached to terminals 504 of device 502, and released from mandrel 200. This can be performed similarly as described above with respect to FIG. 5. Adhesive material 406 can be electrically conductive to provide electrical connection between electrically conductive material 1002 and terminals 504.

Figure 13:
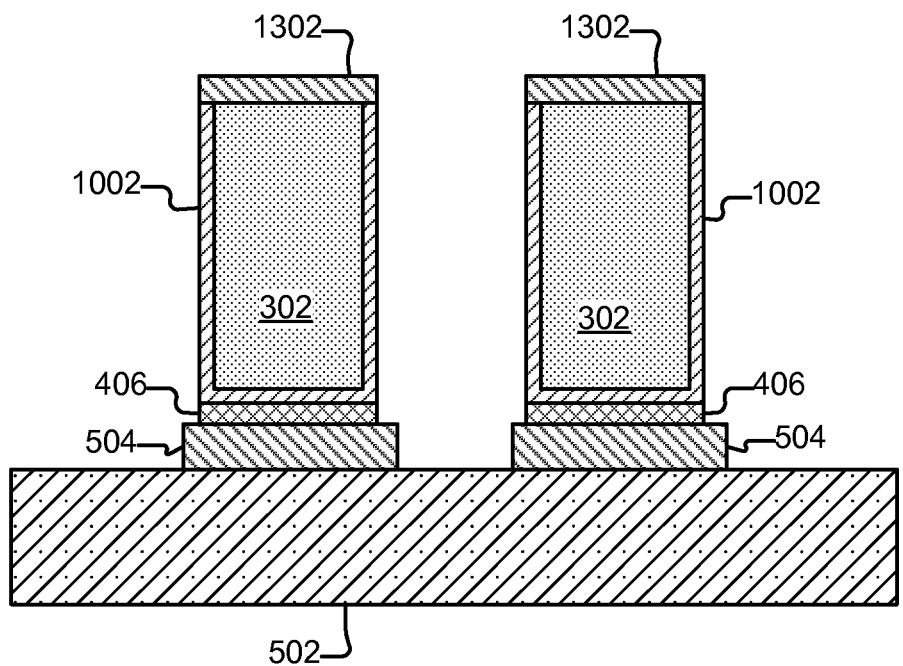

End structures 1302 can be attached to columns 302 as shown in FIG. 13. End structure 1302 can be made of an electrically conductive material. Although a flat structure is shown in FIG. 13, other shapes can be used to provide desired contact characteristics. For example, end structure can have shapes such as a tip (e.g., like 902 of FIG. 9).

Figure 14:
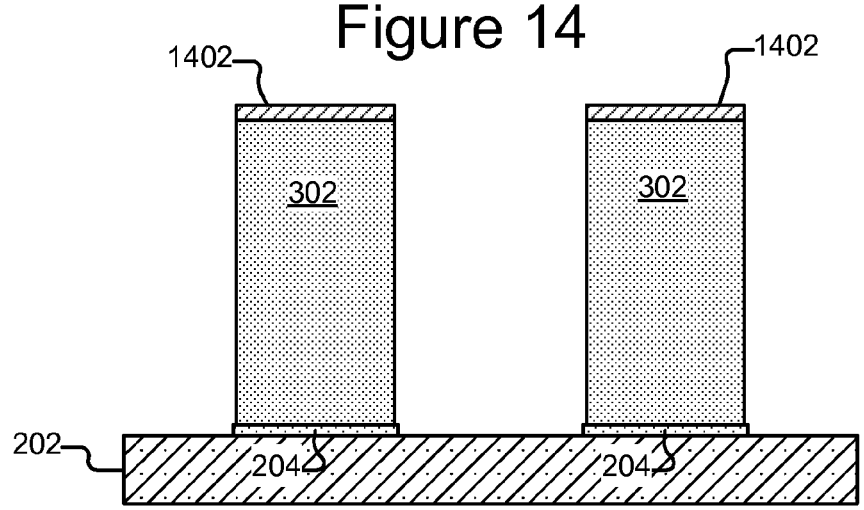
FIGS. 14-16 show a contact structure being fabricated using another variation of a process as in FIG. 1 in accordance with some embodiments of the invention as described further below.
Figure 15:
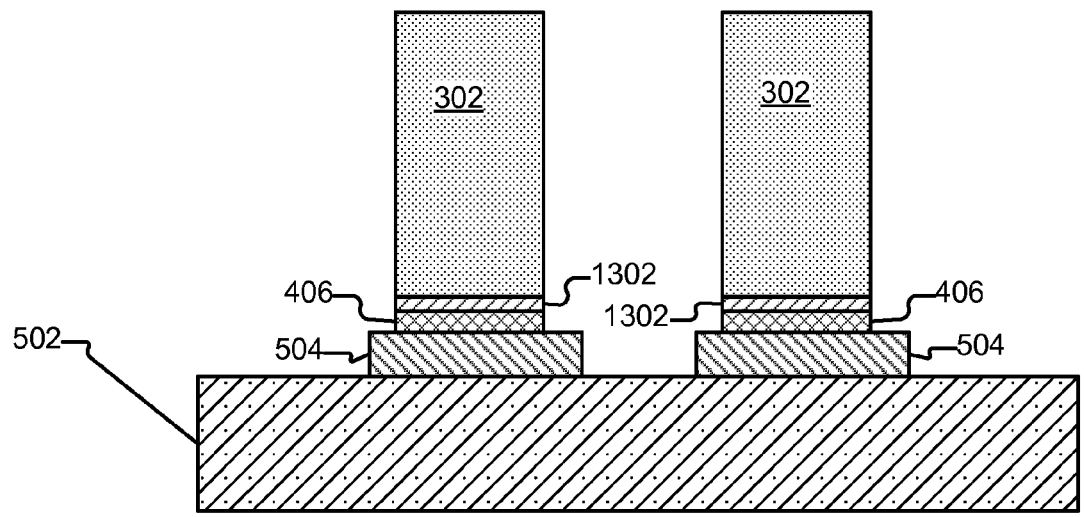
Figure 16:
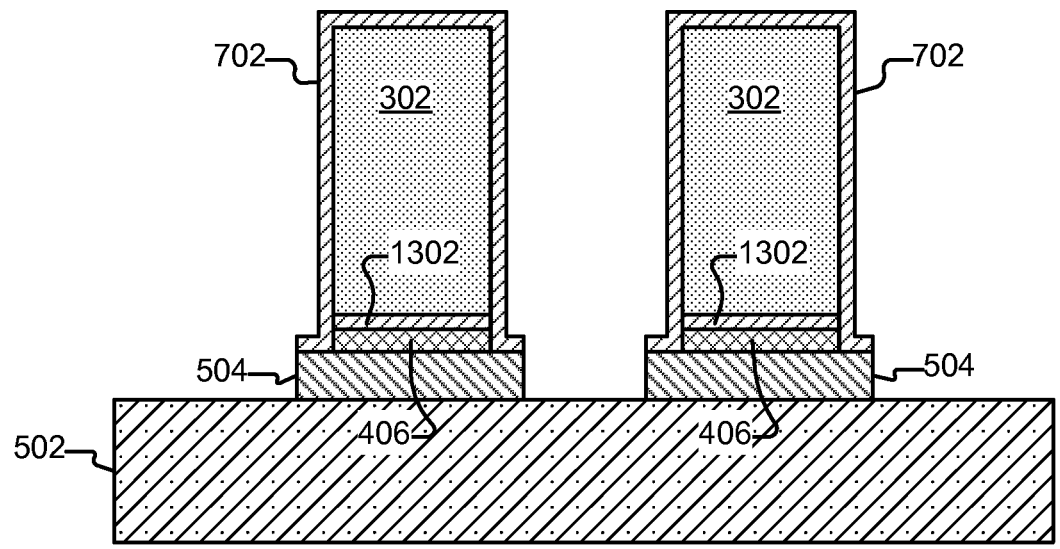

FIGS. 14-16 illustrate another alternate example of operations 102 and 104 of the process of FIG. 1. Columns 302 can be grown on growth surfaces 204 as shown in FIGS. 2A and 3. Then, as shown in FIG. 14, a conductive material 1402 can then be applied to the ends of columns 302. Conductive material 1402 can be like conductive material 702 (described above with respect to FIG. 7) or like conductive material 1002 (described above with respect to FIG. 10).

An adhesive material 406 can then be applied to columns 302, for example, as shown in FIG. 4 and described above. Wicking of adhesive material 406 can be inhibited or prevented by the presence of conductive material 1402. The columns 302 can be attached to terminals 504 of device 502 and released from the mandrel 200 as shown in FIG. 5 and described above. The result is shown in FIG. 15. The conductive material 1402 can impede flow of adhesive material 406 into columns 302, thus reducing or preventing wicking. The adhesive material can be conductive or non-conductive.

Conductive material 702 can be applied to the columns 302 as shown in FIG. 6A-7B and described above to produce the result shown in FIG. 16. The conductive material 702 can thus provide electrical connection to the terminals 504 in place of or in addition to electrical connection between the columns 302, end structures 1302, adhesive material 406 and terminals 504.

If desired, contact tips, like tips 902 of FIG. 9 can be attached to columns as described above.

Figure 17:
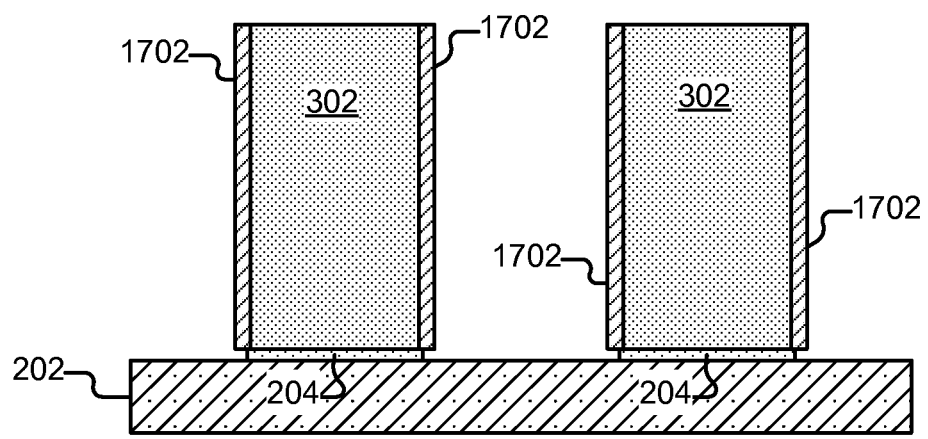
FIGS. 17-19 show a contact structure being fabricated using another variation of a process as in FIG. 1 in accordance with some embodiments of the invention as described further below.
Figure 18:
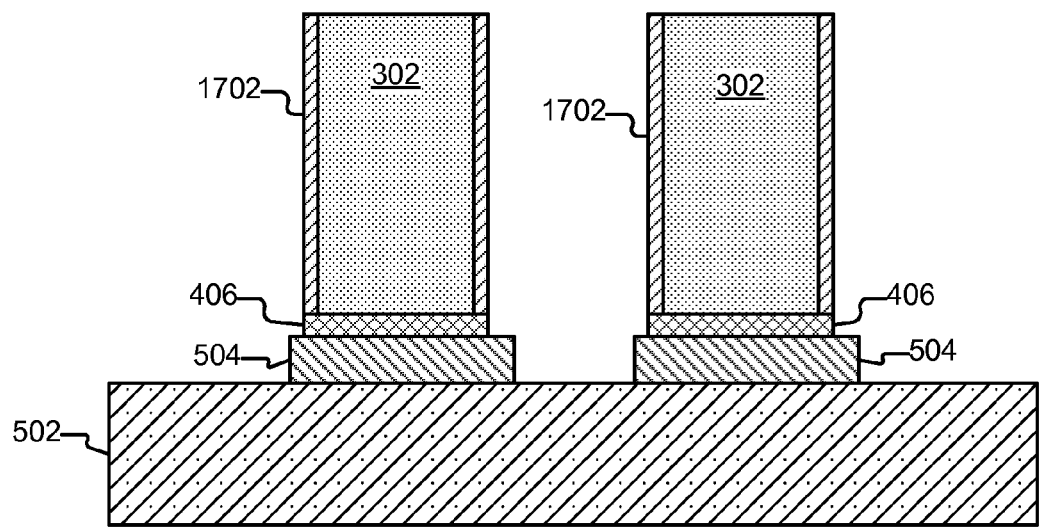
Figure 19:
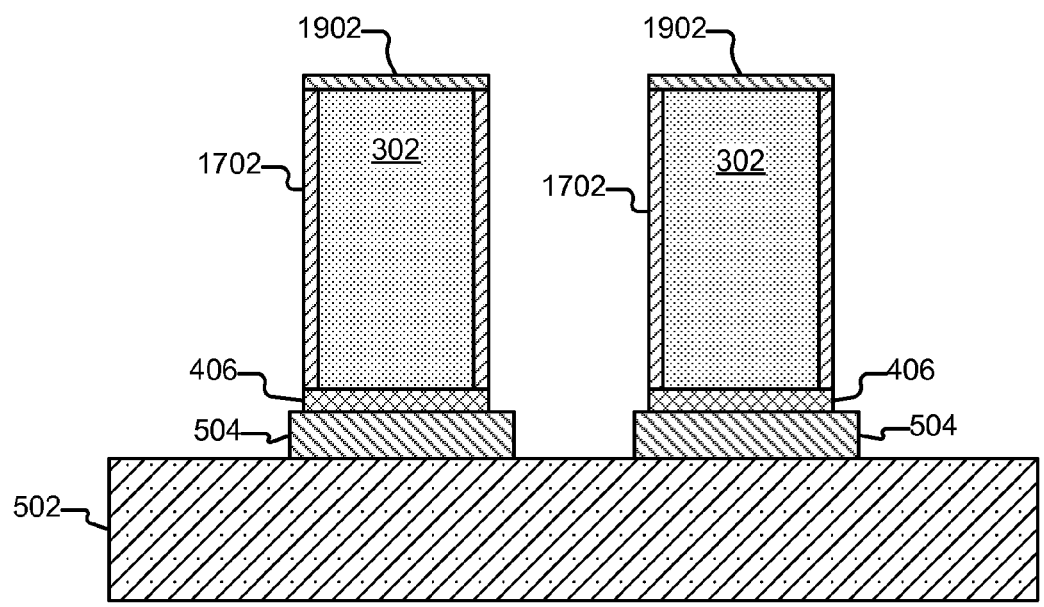
Figure 20A:
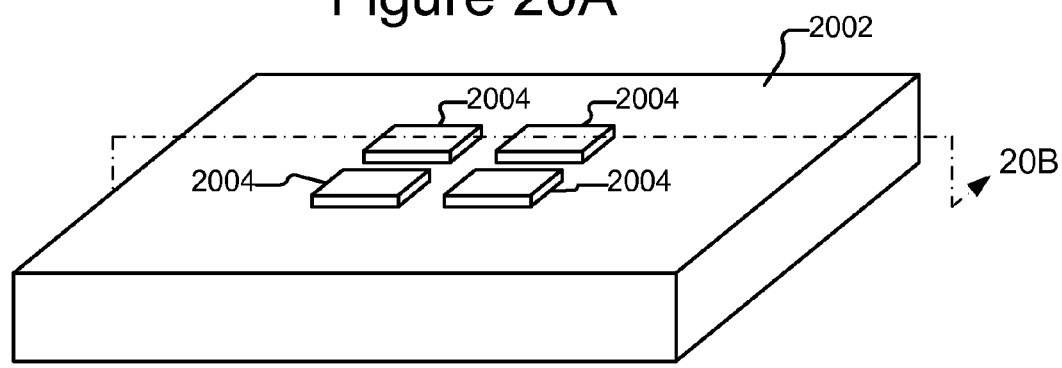
FIG. 20A is a perspective illustration of a substrate on which a solder grid array is being constructed in accordance with some embodiments of the invention.
Figure 20B:
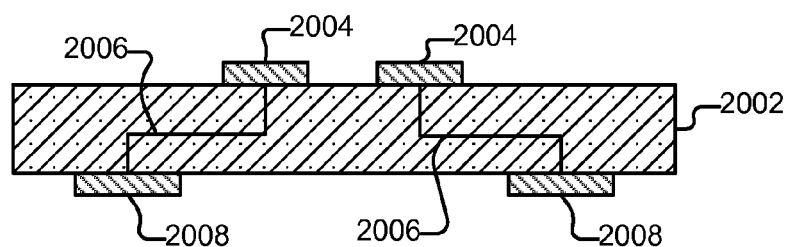
FIG. 20B is a side cross section view illustration of the device of FIG. 20A.

Yet another alternate example of operations 102 and 104 of the process of FIG. 1 is illustrated by FIGS. 17-19. Columns 302 are again grown on growth surfaces 204 as described above and illustrated in FIGS. 2A and 3. Then, conductive material 1702 can be applied to the sides of columns 302, as illustrated in FIG. 17 using techniques as described above and selectively removed from the tops of the columns. Conductive material 1702 can be like conductive material 702 (described above with respect to FIG. 7) or conductive material 1002 (described above with respect to FIG. 10). An adhesive material 406 (e.g., a conductive adhesive material) can then be applied to columns 302, as described above with respect to FIG. 4. Because ends of columns 302 are not covered with conductive material 1702, the adhesive material 406 can wick into the columns 302.

Columns 302 can then be attached to terminals 504 of device 502 and released from mandrel 202, as described above with respect to FIG. 5. The result can be as shown in FIG. 18 in which columns 302 with conductive material 1702 on their sides are attached to terminals 504 of device 502. Adhesive material 406 can be conductive to provide electrical connection between terminals 504 and conductive material 1702.

An end structure 1902 can then be attached to columns 302 as illustrated in FIG. 19. End structure 1902 can be like end structure 1302 in FIG. 13, and can have a variety of shapes including shape with a tip (e.g., like 902 of FIG. 9). The end structure 1902 can be conductive and contact conductive material 1702 to provide electrical connection between the end structure and conductive material.

Conductive material 1702 on the sides of columns 302 can be the same or different than the material of end structure 1902. For example, material 1702 can be ductile while the material of end structure 1902 can be hard. This can help to allow the columns 302 to provide resiliency while the end structure 1902 can be rigid to help to break through an oxide layer on a contact being contacted by the end structure 1902. For example, conductive material applied to the sides of the columns can be a ductile material such as gold, silver, copper, aluminum, or combinations or alloys thereof.

Carbon nanotube columns, for example as described above, can be used in many applications. For example, contacts on an electronic device can be formed using techniques described above.

FIGS. 20A-23 illustrate a solder grid array package in accordance with some embodiments of the present invention in which contact structures 2102 comprise carbon nanotube columns. The solder grid array package can include a substrate 2002, which can be a wiring substrate. For example, wiring substrates can include printed circuit boards, multilayer ceramic wiring substrate, and the like. Substrate 2002 can include terminals 2004 on one side and terminals 2008 on an opposite side. Internal or external traces 2006 can connect terminals 2004 and terminals 2008 (internal traces are shown). Traces 2006 can include electrically conductive lines disposed on the surfaces of substrate 2002 and/or traces embedded within substrate 2002. Traces can, for example, provide a space transformation function, wherein terminals 2004 are disposed on one side of the substrate 2002 at a first spacing (pitch), and terminals 2008 on a second side of the substrate are disposed at a second spacing (pitch) different from the first spacing.

Figure 21:
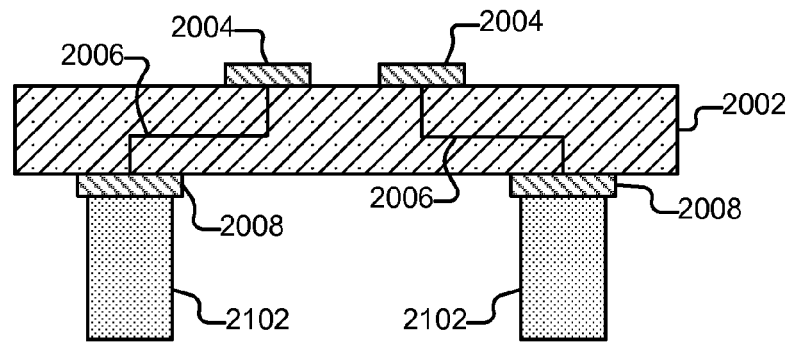
FIG. 21 is a side cross section view illustration of the device of FIGS. 20A and 20B after carbon nanotube columns have been grown on a mandrel and attached to the device in accordance with some embodiments of the invention.
Figure 22:
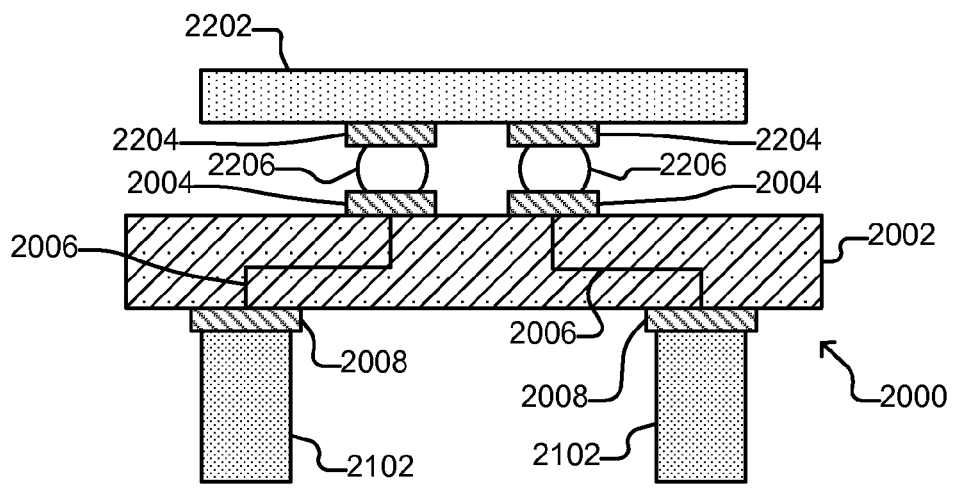
FIG. 22 is a side cross section view illustration of the device of FIG. 21 after a die has been attached in accordance with some embodiments of the invention.

Carbon nanotube column contact structures 2102 can be attached to terminals 2008, for example as shown in FIG. 21. Contact structures can be like columns 302 and made using any of the processes illustrated and described with respect to FIGS. 1-19. Thus, for example, substrate 2002 can be like device 502 in FIGS. 1-19 and contact structures 2102 can be like any of columns 302 shown in FIG. 9 (e.g., with material 702 and tips 902); FIG. 13 (e.g., with material 1002 and 1302), FIG. 16 (e.g., with material 702), or FIG. 19 (e.g., with material 1702 and 1902).

The solder grid array package can be used as follows. A semiconductor die 2202 can be attached to terminals 2004 of substrate 2002. For example, terminals 2204 of the semiconductor die 2202 can be soldered to terminals 2004 of substrate 2002 with solder connections 2206 to form a packaged semiconductor die. Additional structure (not shown) can be included to completely enclose the semiconductor die in the package, including for example, a lid (not shown).

Figure 23:
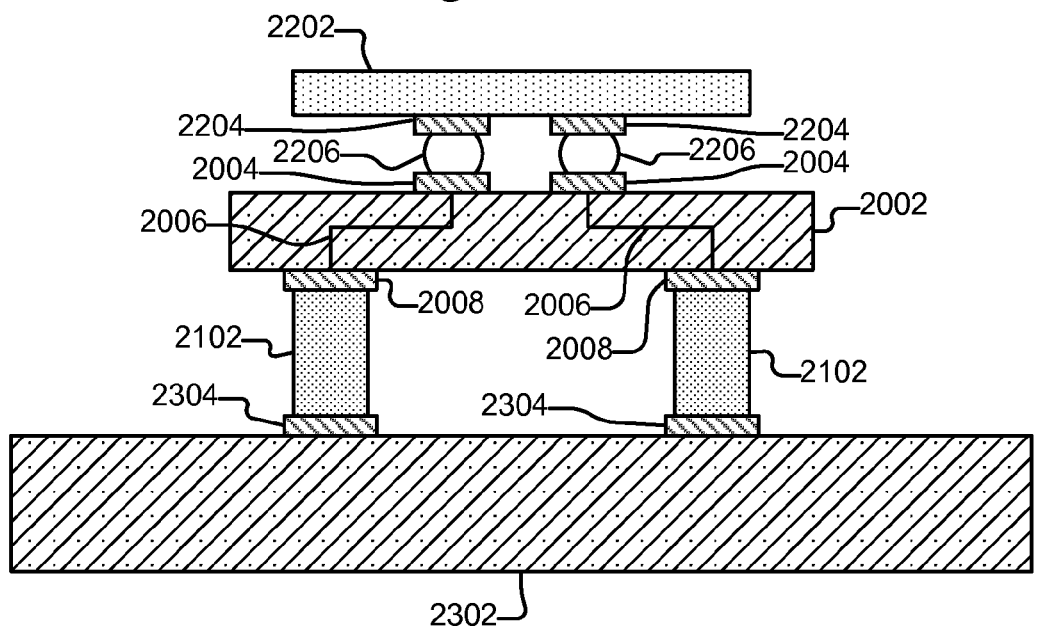
FIG. 23 is a side view illustration shown the device of FIG. 21 attached to a second substrate in accordance with some embodiments of the invention.

The packaged semiconductor die can be attached to terminals 2304 of another electronic device 2302 as illustrated in FIG. 23. For example, the electronic device 2302 can be a printed circuit board having surface mount pads to which the contact structures 2102 are attached. The attachment can be, for example, by solder, a conductive-adhesive, or physical compression in a socket fixture.

Figure 24A:
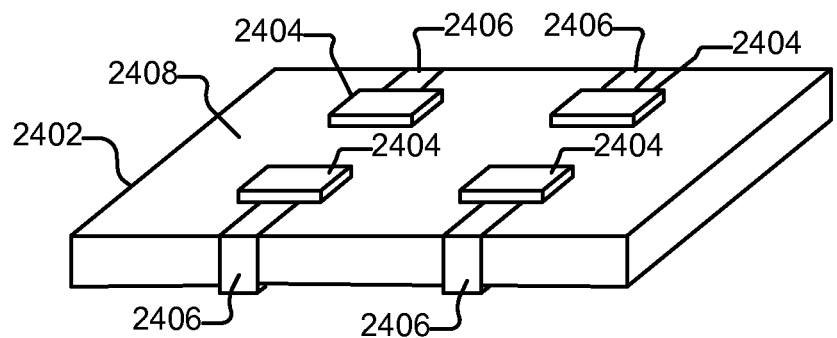
FIG. 24A is a perspective illustration of a die.

Another example in which carbon nanotube columns can be used as contact elements for stacked semiconductor dies as illustrated in FIGS. 24A-26, in accordance with some embodiments of the invention. FIGS. 24A and 24B illustrate a semiconductor die 2402 which can have terminals 2404 disposed on a first side 2408. The semiconductor die can also have terminals 2412 disposed on a second side 2410 opposite the first side 2108. The terminals 2404, 2412 can include input terminals, output terminals, and input/output terminals.

Figure 24B:
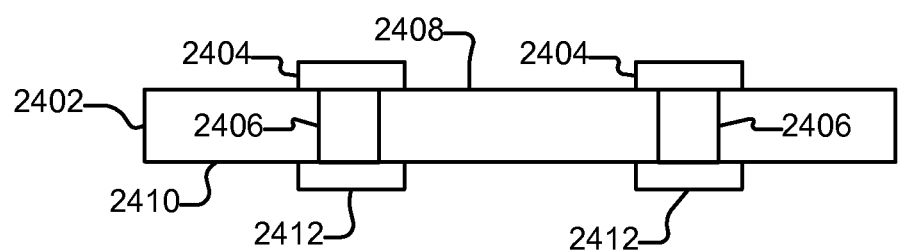
FIG. 24B is a side view illustration of the device of FIG. 24A.
Figure 24C:
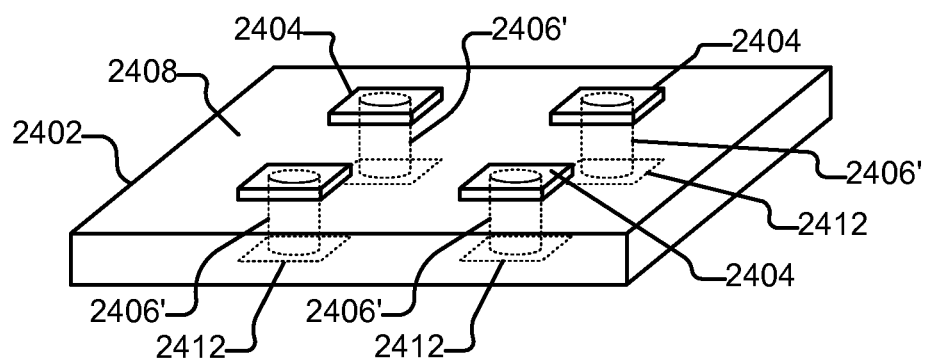
FIG. 24C is a perspective illustration of an alternate configuration of the die of FIGS. 24A and 24B.

The die can also include electrical connectors 2406' which connect the terminals 2404, 2412 on opposite sides together. The connectors 2406 can wrap around the outside of the die 2402 as shown in FIGS. 24A and 24B. For example, the connectors 2406 can be electrically conductive traces. Alternately, the electrical connectors 2406' can pass through the terminals 2404 internally as shown in FIG. 24C. For example, the electrical connectors 2406' can be electrically conductive vias through the die. Either configuration of die can be used, although the following discussion is with respect to the configuration of FIGS. 24A and 24B.

Figure 25:
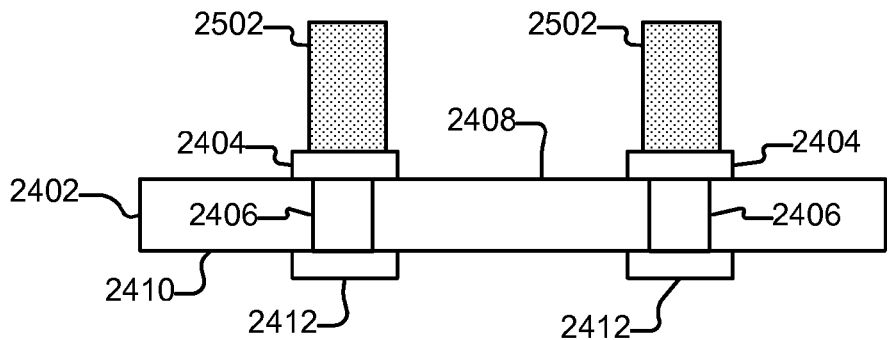
FIG. 25 is a side view illustration of the device of FIGS. 24A and 24B after carbon nanotube columns have been grown on a mandrel and attached to the device in accordance with some embodiments of the invention.

Carbon nanotube column contact structures 2502 can be attached to either terminals 2404 or terminals 2412. For example, as shown in FIG. 25, contact structures 2502 can be attached to terminals 2404. The contact structures 2505 can be like and can be made using any of the processes illustrated in FIGS. 1-19 and described above. Thus, for example, terminals 2404 can be like device 502 in FIGS. 1-19 and contact structures 2502 can be like any of columns 302 as shown in FIG. 9 (e.g., with material 702 and tips 902); FIG. 13 (e.g., with material 1002 and 1302), FIG. 16 (e.g., with material 702), or FIG. 19 (e.g., with material 1702 and 1902).

Figure 26:
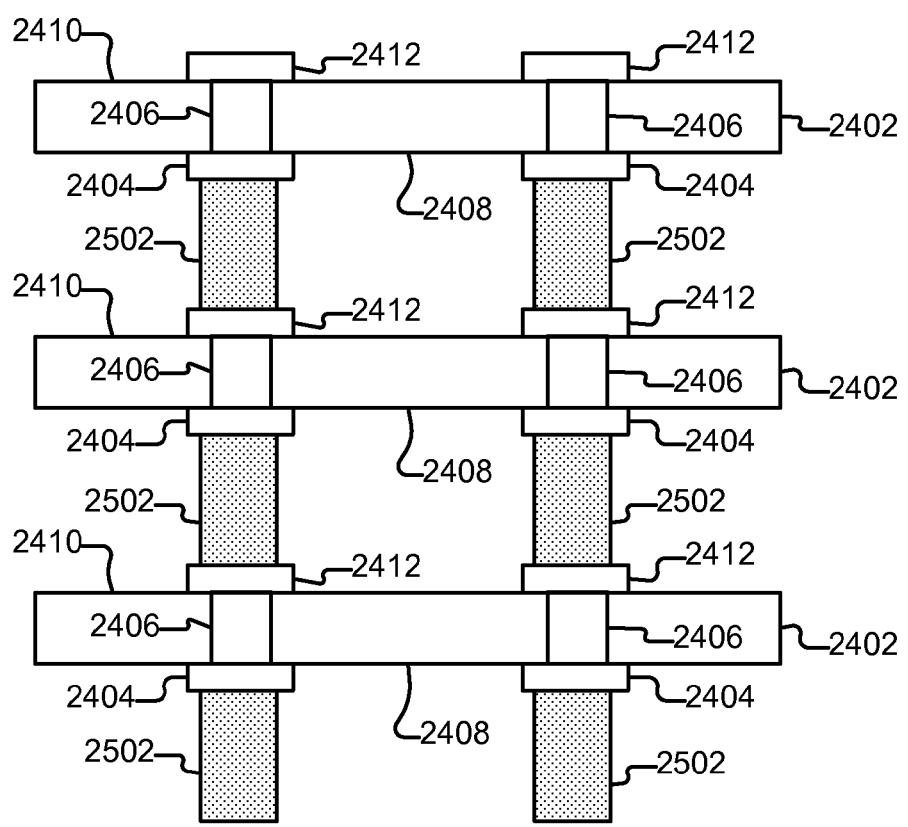
FIG. 26 is a side view illustration of a die stack in accordance with some embodiments of the invention.

As shown in FIG. 26, multiple dies 2402 can be stacked together to form a stacked die module 2600 in accordance with some embodiments of the invention. Carbon nanotube column contact structures 2502 can be attached to terminals 2404 on one die contact and can be electrically connected to terminals 2412 of an adjacent die in the stack 2600. While three dies 2402 are shown stacked together, a lesser or greater number of dies can be included in the stack.

As mentioned above the carbon nanotube column contact structures 2502 can be made and attached to the dies 2402 using any of the processes illustrated and described above. For example, columns for one of the dies can be grown on mandrel 200, attached to the die, and then released. Columns for another of the dies can then be grown on the mandrel 200 and attached to the other die and released from the mandrel 200. Columns for yet another of the dies can then be grown on the mandrel 200 and attached to the yet another of the dies and released from the mandrel. The same mandrel 200 can thus be repeatedly used (reused) to make a plurality of carbon nanotube column contact structures 2502 that are attached to multiple, different dies.

The dies 2402 can be stacked together temporarily or permanently. For example, after carbon nanotube column contact structures 2502 have been attached to each of the dies 2402, the dies can be assembled into a temporary stack for functional testing, burn in, or both. If one or more of the dies 2402 are bad, they can be removed from the stack and a new die inserted to form a new stack that can be retested. When the stack has passed tested, the dies 2402 can be locked into place using a die stack socket or molded into an integrated circuit die stack unit.

Another example of an electronic device is illustrated in FIG. 27 in accordance with an embodiment of the present invention. A die stack, for example, die stack 2600 as illustrated in FIG. 26 can be connected to a solder grid array, for example, electronic device 2302 as described in FIG. 23. The die stack 2600 and the substrate 2002 it is connected to can be connected to a second electronic device 2302 via carbon nanotube column contact structure 2102. The contact structures 2102 can be formed on a mandrel and attached to either terminals 2008 of substrate 2002 or attached to terminals 2304 of electronic device 2302.

FIG. 28 illustrates another example electronic device in the form of an interposer in accordance with some embodiments of the invention. The interposer 2800 can be like the device of FIG. 21, and can include a substrate 2002 having terminals 2004, 2008 disposed on opposite sides. Terminals 2004 can be arranged in a similar pattern as terminals 2008. Disposed on terminals 2004 can be carbon nanotube column contact elements 2802, 2804. Carbon nanotube column contact elements 2802, 2804 can be like any of columns 302 shown in FIG. 9 (e.g., with material 702 and tips 902); FIG. 13 (e.g., with material 1002 and 1302), FIG. 16 (e.g., with material 702), or FIG. 19 (e.g., with material 1702 and 1902). As described above, carbon nanotube column contact elements 2802, 2804 can be formed on a mandrel and then attached to the substrate 2002.

In some embodiments of the present invention, the use of carbon nanotube columns to provide contact elements can provide a number of advantages. For example, carbon nanotube columns can be resilient while maintaining high strength. When placed under a vertically-applied load (e.g., aligned with the length axis of the columns or parallel to the orientation of the carbon nanotubes), carbon nanotube columns can provide a spring action while permitting but minimizing lateral displacement. This can enable very fine pitch spacing of the columns (e.g., spacings of 30 micrometers, or less, or more particularly spacings of 25 micrometers or less, or even more particularly spacings of 20 micrometers or less).

In some embodiments of the present invention, carbon nanotube columns can be grown into high aspect ratio structures. For example, columns can have length to width ratios of 3:1, or more particularly length to width ratios of 10:1, or even more particularly length to width ratios of 25:1. In contrast, it is difficult to form high aspect ratio structures using conventional lithographic techniques.

In some embodiments of the present invention, carbon nanotube columns can also have highly rectangular cross sectional shapes, providing an almost ribbon-like shape. For example, cross-sectional dimensions can have ratios of less than 2:1, or more particularly less than 10:1, or even more particularly less than 100:1. Such shapes can be beneficial, for example, in providing low inductance contact structures.

In some embodiments of the present invention, the carbon nanotube columns can have varying dimensions. For example, width or cross-sectional diameter of the carbon nanotube columns can be less than 1 millimeter, or more particularly less than 200 micrometers, or even more particularly less than 25 micrometers.

Although specific embodiments and applications of the invention have been described in this specification, these embodiments and applications are exemplary only, and many variations are possible. Particular exemplary contact structures and processes for making contact structures have been disclosed, but it will be apparent that the inventive concepts described above can apply equally to alternate shapes and arrangements. Moreover, while specific exemplary processes for fabricating contact structures have been disclosed, variations in the order of the processing steps, substitution of alternate processing steps, elimination of some processing steps, or combinations of multiple processing steps that do not depart from the inventive concepts are contemplated. Accordingly, the invention is not to be limited except as defined by the following claims.

What is claimed is:

1. A method of making carbon nanotube contact structures on a first electronic device, comprising:

growing a plurality of first carbon nanotube columns on a mandrel;

applying an electrically-conductive adhesive to ends of the first columns distal from the mandrel;

transferring the first columns to the first electronic device by bringing the ends of the first columns distal from the mandrel into contact with first terminals of the first electronic device;

separating the mandrel from the first columns to leave the first columns attached to the first terminals of the first electronic device by the electrically-conductive adhesive;

depositing an electrically-conductive material onto the first columns; and reusing the mandrel to grow a second plurality of carbon nanotube columns on the mandrel, wherein the applying an electrically-conductive adhesive comprises bringing a stamping tool into contact with the ends of the first columns distal from the mandrel to transfer the electrically-conductive adhesive from the stamping tool onto the ends of the first columns, wherein the electrically-conductive adhesive is applied to the stamping tool using a technique selected from the group consisting of coating and patterning.

2. The method of claim 1, wherein the separating the mandrel from the first columns comprises physically separating the mandrel and the first electronic device.

3. The method of claim 1, wherein the separating the mandrel from the first columns comprises applying a thermal shock to at least one of the first columns and the mandrel.

4. The method of claim 1, wherein the depositing an electrically-conductive material is performed before the applying a conductive adhesive and the transferring the first columns to the first electronic device.

5. The method of claim 1, wherein the depositing an electrically-conductive material is performed after the transferring the first columns to the first electronic device.

6. The method of claim 1, wherein the depositing an electrically-conductive material comprises:
   placing a first electrically-conductive material onto the first columns before the transferring the first columns to the first electronic device; and
   placing a second electrically-conductive material onto the first columns after the transferring the columns to the first electronic device.

7. The method of claim 6, wherein:
   the first electrically-conductive material is selected from the group of ductile metals consisting of gold, silver, copper, aluminum, and combinations and alloys thereof; and
   the second electrically-conductive material is selected form the group of rigid metals consisting of rhodium, nickel, palladium, cobalt, and combinations and alloys thereof.

8. The method of claim 1, further comprising attaching tip structures onto ends of the first columns distal from the first electronic device.

9. The method of claim 1 further comprising attaching a semiconductor die to second terminals of the first electronic device, wherein the second terminals of the first electronic device are on an opposite side of the first electronic device from the first terminals, and ones of the first terminals are electrically connected to ones of the second terminals.

10. An electronic device comprising carbon nanotube contact structures formed in accordance with the method of claim 1.

11. A method of making carbon nanotube contact structures on a first electronic device, comprising:
   growing a plurality of first carbon nanotube columns on a mandrel;
   applying an electrically-conductive adhesive to ends of the first columns distal from the mandrel;
   transferring the first columns to the first electronic device by bringing the ends of the first columns distal from the mandrel into contact with first terminals of the first electronic device;
   separating the mandrel from the first columns to leave the first columns attached to the first terminals of the first electronic device by the electrically-conductive adhesive;
   depositing an electrically-conductive material onto the first columns; and reusing the mandrel to grow a second plurality of carbon nanotube columns on the mandrel, wherein the depositing an electrically-conductive material comprises:
   positioning a stencil over the first electronic device such that the first columns extend through holes in the stencil and the first terminals of the device are exposed through the holes in the stencil; and
   applying the electrically-conductive material through holes in the stencil to deposit the electrically-conductive material onto to the first columns and the first terminals.

12. The method of claim 11, wherein the applying an electrically-conductive adhesive comprises bringing a stamping tool into contact with the ends of the first columns distal from the mandrel to transfer the electrically-conductive adhesive from the stamping tool onto the ends of the first columns, wherein the electrically-conductive adhesive is applied to the stamping tool using a technique selected from the group consisting of coating and patterning.

* * * * *